US009253425B2

(12) United States Patent
Ryoki et al.

(10) Patent No.: US 9,253,425 B2
(45) Date of Patent: *Feb. 2, 2016

(54) PHOTO-ELECTRIC CONVERSION DEVICE FOR CURRENT FLUCTUATION SUPPRESSION (71) Applicant: CANON KABUSHIKI KAISHA, Tokyo (JP)

(72) Inventors: Tatsuya Ryoki, Kawasaki (JP); Seiichirou Sakai, Ebina (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,313

(22) Filed: Sep. 25, 2014

(65) Prior Publication Data

US 2015/0009389 A1   Jan. 8, 2015

Related U.S. Application Data (63) Continuation of application No. 12/758,086, filed on Apr. 12, 2010, now Pat. No. 8,872,092.

(30) Foreign Application Priority Data

Apr. 17, 2009 (JP) .................. 2009-101382
Mar. 31, 2010 (JP) .................. 2010-081641

(51) Int. Cl.
*H01L 27/00* (2006.01)
*H01J 40/14* (2006.01)
(Continued)

(52) U.S. Cl.
CPC .............. *H04N 5/369* (2013.01); *H01L 27/146* (2013.01); *H01L 27/14603* (2013.01);
(Continued)

(58) Field of Classification Search
USPC ............... 250/208.1, 214 R, 214.1, 214 SW; 348/266, 272, 281–283, 294, 297, 348/302–304, 307, 308, 311, 322–324; 257/291–293
See application file for complete search history.

(56) References Cited

U.S. PATENT DOCUMENTS 4,663,669 A   5/1987 Kinoshita et al.
4,774,585 A   9/1988 Suga et al.
(Continued)

FOREIGN PATENT DOCUMENTS

JP   S57-075074 A   5/1982
JP   S59-218771 A   12/1984
(Continued)

*Primary Examiner* — Pascal M Bui Pho
(74) *Attorney, Agent, or Firm* — Fitzpatrick, Cella, Harper & Scinto (57) ABSTRACT A photo-electric conversion device comprises a pixel array in which a plurality of pixels are arrayed, each pixel including a photo-electric converter, a floating diffusion portion, a transfer unit which transfers charges generated in the photo-electric converter to the floating diffusion portion, and an output unit which outputs a signal corresponding to a potential of the floating diffusion portion, a signal line which is connected to the plurality of pixels and transmits a signal output from each pixel, a load transistor including a drain connected to the signal line, and a source connected to a first reference potential, and a capacitance including a first electrode connected to a gate of the load transistor, and a second electrode connected to a second reference potential, wherein the signal line is arranged not to overlap the first electrode when viewed from a direction perpendicular to a light-receiving surface of the photo-electric converter.

9 Claims, 6 Drawing Sheets (51) Int. Cl.
*H04N 5/369* (2011.01)
*H04N 5/372* (2011.01)
*H01L 27/146* (2006.01)
*H04N 5/374* (2011.01)

(52) U.S. Cl.
CPC ... *H01L 27/14609* (2013.01); *H01L 27/14612* (2013.01); *H01L 27/14645* (2013.01); *H04N 5/372* (2013.01); *H04N 5/374* (2013.01)

(56) References Cited

U.S. PATENT DOCUMENTS

| | | | |
|---|---|---|---|
| 5,933,189 A * | 8/1999 | Nomura | 348/302 |
| 6,188,094 B1 | 2/2001 | Kochi et al. | |
| 6,670,990 B1 | 12/2003 | Kochi et al. | |
| 6,960,751 B2 | 11/2005 | Hiyama et al. | |
| 7,016,089 B2 | 3/2006 | Yoneda et al. | |
| 7,023,482 B2 | 4/2006 | Sakuragi | |
| 7,110,030 B1 | 9/2006 | Kochi et al. | |
| 7,227,208 B2 | 6/2007 | Ogura et al. | |
| 7,321,110 B2 | 1/2008 | Okita et al. | |
| 7,324,144 B1 | 1/2008 | Koizumi | |
| 7,408,210 B2 | 8/2008 | Ogura et al. | |
| 7,429,764 B2 | 9/2008 | Koizumi et al. | |
| 7,460,162 B2 | 12/2008 | Koizumi et al. | |
| 7,466,003 B2 | 12/2008 | Ueno et al. | |
| 7,538,810 B2 | 5/2009 | Koizumi et al. | |
| 7,554,591 B2 | 6/2009 | Kikuchi et al. | |
| 7,629,568 B2 | 12/2009 | Koizumi et al. | |
| 7,638,826 B2 | 12/2009 | Hiyama et al. | |
| 8,345,133 B2 | 1/2013 | Matsuda et al. | |
| 8,477,224 B2 | 7/2013 | Ogura et al. | |
| 8,872,092 B2 * | 10/2014 | Ryoki et al. | 250/214 R |
| 2003/0117510 A1 * | 6/2003 | Sakurai et al. | 348/308 |
| 2006/0044439 A1 | 3/2006 | Hiyama et al. | |
| 2006/0157759 A1 | 7/2006 | Okita et al. | |
| 2008/0036891 A1 | 2/2008 | Ono et al. | |
| 2008/0062294 A1 | 3/2008 | Koizumi et al. | |
| 2008/0062295 A1 | 3/2008 | Fujimura et al. | |
| 2008/0062296 A1 | 3/2008 | Ogura et al. | |
| 2009/0073298 A1 | 3/2009 | Ogura et al. | |
| 2009/0207293 A1 | 8/2009 | Ryoki et al. | |
| 2009/0218479 A1 | 9/2009 | Arishima et al. | |
| 2009/0219429 A1 | 9/2009 | Ogura et al. | |
| 2010/0002114 A1 | 1/2010 | Ogura et al. | |
| 2010/0060754 A1 | 3/2010 | Ogura et al. | |
| 2010/0066881 A1 | 3/2010 | Ryoki et al. | |

FOREIGN PATENT DOCUMENTS

| | | | | |
|---|---|---|---|---|
| JP | 2002-152565 A | | 5/2002 | |
| JP | 2007-129473 | * | 5/2007 | ............ H04N 5/335 |
| JP | 2007-129473 A | | 5/2007 | |

* cited by examiner

SECTIONAL VIEW TAKEN ALONG A - A'

PHOTO-ELECTRIC CONVERSION DEVICE FOR CURRENT FLUCTUATION SUPPRESSION

This application is a continuation of pending application Ser. No. 12/758,086, filed Apr. 12, 2010, which has been allowed.

BACKGROUND OF THE INVENTION

1. Field of the Invention

The present invention relates to a photo-electric conversion device and an image capturing system.

2. Description of the Related Art

Japanese Patent Laid-Open No. 2002-152565 discloses a solid-state image capturing device in which a hold capacitance 26' is connected to the gate of a load transistor 9 connected to an amplification transistor 4 of a photo-electric conversion cell via a vertical signal line 8 (FIG. 1 of Japanese Patent Laid-Open No. 2002-152565). A constant current source 25 is connected to the hold capacitance 26' via switches 27 and 28. During a period the switches 27 and 28 are ON, the hold capacitance 26' samples a bias current supplied from the constant current source 25. After that, during a period the switches 27 and 28 are OFF, the hold capacitance 26' holds the bias current. According to Japanese Patent Laid-Open No. 2002-152565, it is supposed to be possible to suppress a fluctuation in the set current of the load transistor 9. Japanese Patent Laid-Open No. 2007-129473 describes a solid-state image capturing device in which a capacitor 7 is connected between ground and the gate electrode of a field effect transistor 10 which forms the load of a current source provided on a vertical signal line 2 (FIG. 1 of Japanese Patent Laid-Open No. 2007-129473). According to Japanese Patent Laid-Open No. 2007-129473, it is supposed to be possible to prevent a fluctuation in the potential of the vertical signal line corresponding to the current supplied from the field effect transistor 10 because a fluctuation in the potential of the gate electrode of the field effect transistor 10 can be suppressed.

However, Japanese Patent Laid-Open No. 2002-152565 includes no description about how to reduce the coupling capacitance between the vertical signal line 8 and the hold capacitance 26'. When the coupling capacitance between the vertical signal line 8 and the hold capacitance 26' increases, the voltage held by the hold capacitance 26' when a large signal is output to the vertical signal line 8 upon incidence of high-intensity light on the photo-electric conversion cell is readily fluctuated. Since this changes the gate voltage of the load transistor 9, the fluctuation in the set current of the load transistor 9 may be large. Japanese Patent Laid-Open No. 2007-129473 has no description about how to reduce the coupling capacitance between the vertical signal line 2 and the capacitor 7. When the coupling capacitance between the vertical signal line 2 and the capacitor 7 increases, the voltage held by the capacitor 7 when a large signal is output to the vertical signal line 2 upon incidence of high-intensity light on the pixel is readily fluctuated. Since this changes the gate voltage of the field effect transistor 10, the fluctuation in the constant current supplied by the field effect transistor 10 may be large.

SUMMARY OF THE INVENTION

The present invention is advantageous for suppressing a fluctuation in the constant current of a load transistor caused by the coupling capacitance between a signal line and the first electrode of a capacitance.

One of the aspects of the present invention provides a photo-electric conversion device comprises a pixel array in which a plurality of pixels are arrayed, each pixel including a photo-electric converter, a floating diffusion portion, a transfer unit which transfers charges generated in the photo-electric converter to the floating diffusion portion, and an output unit which outputs a signal corresponding to a potential of the floating diffusion portion, a signal line which is connected to the plurality of pixels and transmits a signal output from each pixel, a load transistor including a drain connected to the signal line, and a source connected to a first reference potential, and a capacitance including a first electrode connected to a gate of the load transistor, and a second electrode connected to a second reference potential, wherein the signal line is arranged not to overlap the first electrode when viewed from a direction perpendicular to a light-receiving surface of the photo-electric converter.

Further features of the present invention will become apparent from the following description of exemplary embodiments with reference to the attached drawings.

DESCRIPTION OF THE EMBODIMENTS

Figure 1:
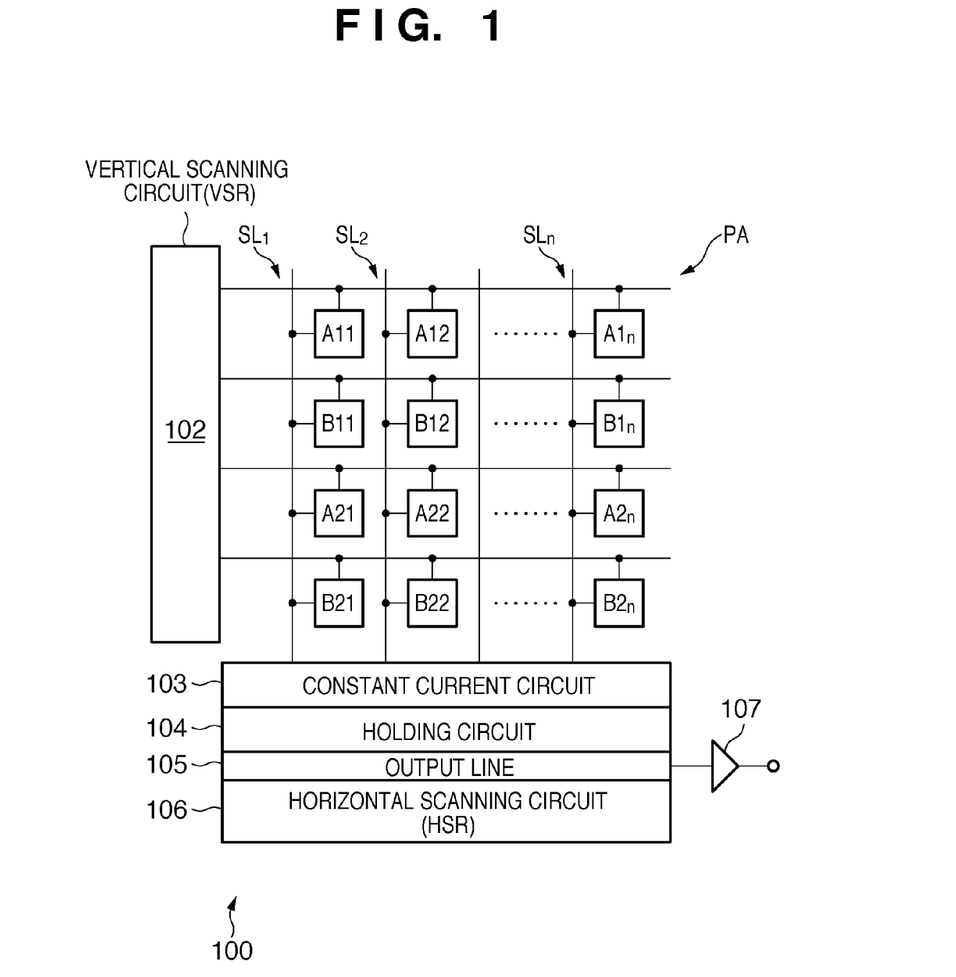
FIG. 1 is a view showing the schematic arrangement of a photo-electric conversion device 100 according to the first embodiment.
Figure 2A:
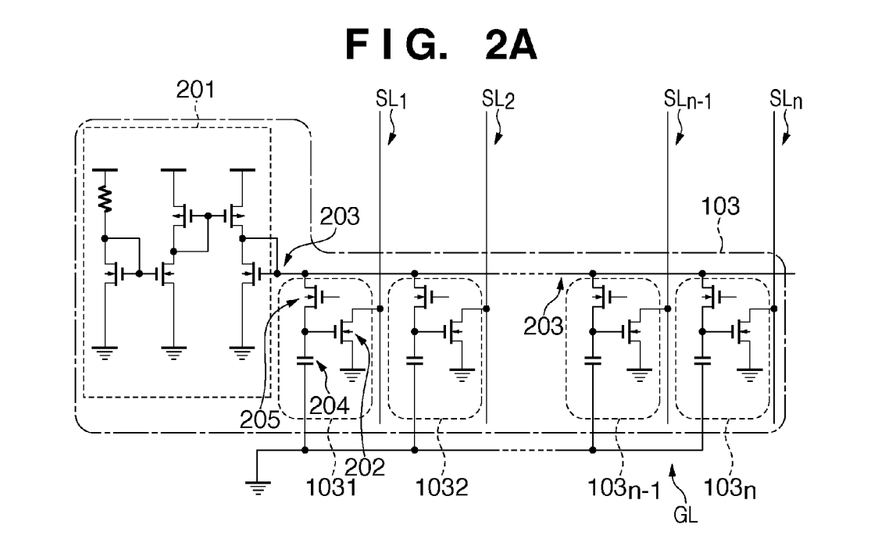
FIGS. 2A and 2B are circuit diagrams showing the arrangement of a constant current circuit 103 according to the first embodiment.
Figure 2B:
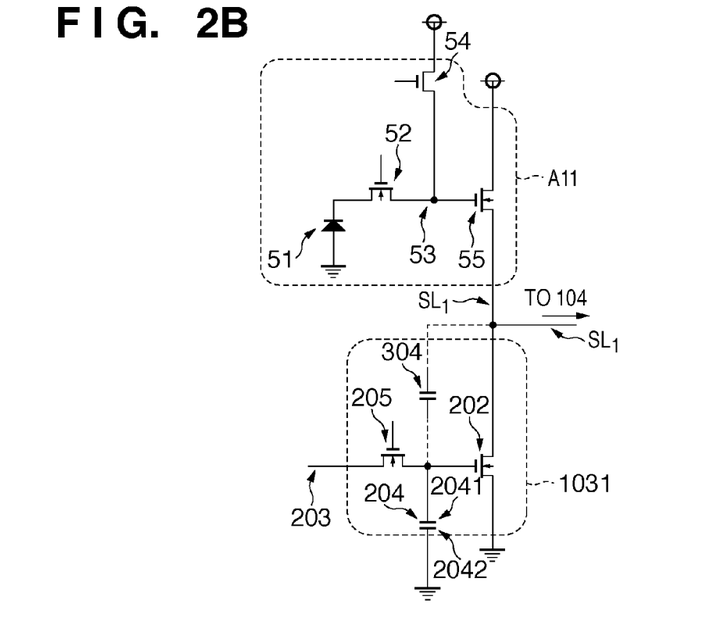

The arrangement of a photo-electric conversion device 100 according to the first embodiment of the present invention will be described with reference to FIG. 1. The photo-electric conversion device 100 may include a pixel array PA, a vertical scanning circuit (VSR) 102, a signal lines $SL_1$ to $n_n$, a constant current circuit 103, a holding circuit 104, an output line 105, a horizontal scanning circuit (HSR) 106, and an output amplifier 107. In the pixel array PA, a plurality of pixels A11 to B2n are arrayed one- or two-dimensionally. As shown in FIG. 2B, the pixel A11 may include a photo-electric converter 51, a transfer unit 52, a floating diffusion portion 53, a reset unit 54, and an output unit 55. Note that FIG. 2B exemplifies the arrangement of the pixel A11. The remaining pixels have the same arrangement as that of the pixel A11. The photo-electric converter 51 generates and accumulates charges corresponding to light. The photo-electric converter 51 can be, for example, a photodiode. The transfer unit 52 transfers the charges generated in the photo-electric converter 51 to the charge-voltage converter 53. The transfer unit 52 can be, for example, a transfer transistor which is turned on when its gate has received a transfer control signal of active level from the vertical scanning circuit 102, thereby transferring the charges generated in the photo-electric converter 51 to the floating diffusion portion 53. The reset unit 54 resets the floating diffusion portion 53, and also sets the pixel A11 in a selected state or unselected state in accordance with an applied reset potential. The reset unit 54 can be, for example, a reset transistor which is turned on when its gate has received a reset control signal of active level from the vertical scanning circuit 102, thereby resetting the floating diffusion portion 53. The reset unit 54 resets the potential of the floating diffusion portion 53 to a first potential in accordance with an applied first reset potential (for example, H level), thereby setting the pixel A11 in the selected state. The reset unit 54 resets the potential of the floating diffusion portion 53 to a second potential in accordance with an applied second reset potential (for example, L level), thereby setting the pixel A11 in the unselected state. The output unit 55 outputs, to the signal line $SL_1$, a signal corresponding to the potential of the floating diffusion portion 53. The output unit 55 includes, for example, an amplification transistor whose gate electrode is connected to the floating diffusion portion 53. The amplification transistor can be arranged to perform a source follower operation in cooperation with a load transistor 202 (to be described later) connected to the signal line $SL_1$ to output a signal corresponding to the potential of the floating diffusion portion 53 to the signal line $SL_1$. More specifically, in a state in which the reset unit 54 has reset the floating diffusion portion 53, the output unit 55 outputs a noise signal corresponding to the potential to the floating diffusion portion 53 to the signal line $SL_1$. In a state in which the transfer unit 52 has transferred the charges from the photo-electric converter 51 to the floating diffusion portion 53, the output unit 55 outputs an optical signal corresponding to the potential to the floating diffusion portion 53 to the signal line $SL_1$. Note that the pixel A11 may include a selection unit (not shown). In this case, the selection unit sets the pixel A11 in the selected state or unselected state in accordance with a selection control signal controlled by the vertical scanning circuit 102. The selection unit can be, for example, a selection transistor which is turned on when its gate has received a selection control signal of active level from the vertical scanning circuit 102, thereby setting the pixel A11 in the selected state. The selection unit is turned off when its gate has received a selection control signal of inactive level from the vertical scanning circuit 102, thereby setting the pixel A11 in the unselected state. The vertical scanning circuit 102 vertically scans the pixel array PA to select a row in the pixel array PA to read signals from the pixels in the selected row and output to the plurality of signal lines SL (SL1 to SLn). The constant current circuit 103 shown in FIG. 1 includes a plurality of load transistors 202 connected to the plurality of signal lines SL ($SL_1$ to $SL_n$), respectively. Each load transistor 202 supplies a constant current to the connected signal line SL. The holding circuit 104 temporarily holds signals (noise signals/optical signals) of a plurality of columns output from the selected row via the plurality of signal lines SL ($SL_1$ to $SL_n$). The horizontal scanning circuit 106 horizontally scans the holding circuit 104 so that the signals (noise signals/optical signals) of the plurality of columns held by the holding circuit 104 are sequentially transferred to the output amplifier 107 via the output line 105. The output amplifier 107 generates an image signal in accordance with the transferred signals (noise signals/optical signals). For example, the output amplifier generates an image signal by calculating the difference between the noise signals and the optical signals. The output amplifier 107 outputs the generated image signal to the succeeding stage (captured image signal processing circuit 95 to be described later). Note that the photo-electric conversion device 100 may include an amplifier or a clamp circuit between each column of the pixel array PA and the holding circuit 104. The signal held by the holding circuit 104 may be not the above-described noise signal but a signal including the offset of the amplifier.

The arrangement of the constant current circuit 103 will be described next with reference to FIG. 2A. FIG. 2A is an equivalent circuit diagram showing the simplified arrangement of the constant current circuit 103. The constant current circuit 103 includes a bias supply circuit (supply unit) 201, common gate line 203, and a plurality of current source circuits $103_1$ to $103_n$. The bias supply circuit 201 applies a bias voltage to the plurality of current source circuits $103_1$ to $103_n$ via the common gate line 203. The plurality of current source circuits $103_1$ to $103_n$ are connected to a second reference potential via a common reference potential line GL. The second reference potential is, for example, the ground potential. In that case, the reference potential line GL is a ground line. The plurality of current source circuits $103_1$ to $103_n$ receive the common second reference potential via the reference potential line GL. The bias supply circuit 201 is formed from two current mirror circuits and one transistor. The plurality of current source circuits $103_1$ to $103_n$ are provided in correspondence with the plurality of columns of the pixel array PA, i.e., the plurality of signal lines $SL_1$ to $SL_n$. The current source circuit $103_1$ includes the load transistor 202, hold capacitance (capacitance) 204, and switch 205. The load transistor 202 has a drain connected to the signal line SL, a source connected to the first reference potential via the reference potential line GL, and a gate connected to a first electrode 2041 (to be described later) and the switch 205. In this embodiment, the first reference potential equals the second reference potential. However, the first reference potential and the second reference potential may be different. The first reference potential is, for example, the ground potential. When the first reference potential is different from the second reference potential, the source of the load transistor 202 is connected to the first reference potential via a reference potential line different from the reference potential line GL. The sources of the plurality of load transistors 202 may be connected to a reference potential line which applies the first reference potential to them. The different reference potential line is, for example, a ground line. The load transistor 202 forms the load of the constant current source so as to supply, to the signal line SL, a constant current corresponding to the voltage applied to the gate. The hold capacitance 204 is provided between the common gate line 203 and the reference potential line GL. The hold capacitance 204 includes the first electrode 2041 and a second electrode 2042. The first electrode 2041 is connected to the gate of the load transistor 202. The second electrode 2042 is connected to the second reference potential via the reference potential line GL. The switch 205 is turned on to connect the hold capacitance 204 to the common gate line 203, or turned off to disconnect the hold capacitance 204 from the common gate line 203. When the switch 205 is turned on, the hold capacitance 204 applies the bias voltage supplied from the bias supply circuit 201 to the gate of the load transistor 202. FIG. 2B is a circuit diagram showing the arrangement of one column in FIG. 2A together with a pixel. A plurality of pixels are connected to each signal line SL. However, FIG. 2B shows only one pixel. As shown in FIG. 2B, a coupling capacitance 304 is present between the signal line SL and the first electrode 2041. During a period except the period of transferring the optical signals/noise signals to the holding circuit, the switch 205 of each column is turned on to cause the hold capacitance 204 to sample the bias voltage from the common gate line 203. After that, during the period of transferring the optical signals/noise signals to the holding circuit 104 via the signal lines SL (S read period/N read period), the switch 205 of each column is turned off to cause the hold capacitance 204 to hold the bias voltage. This suppresses a fluctuation in the gate potential of the load transistor 202 of each column. It is therefore possible to suppress a fluctuation in the gate potential of the load transistor 202 when noise is superimposed on the common gate line 203. That is, even when noise is superimposed on the common gate line 203, almost the same constant current can be maintained.

Figure 3A:
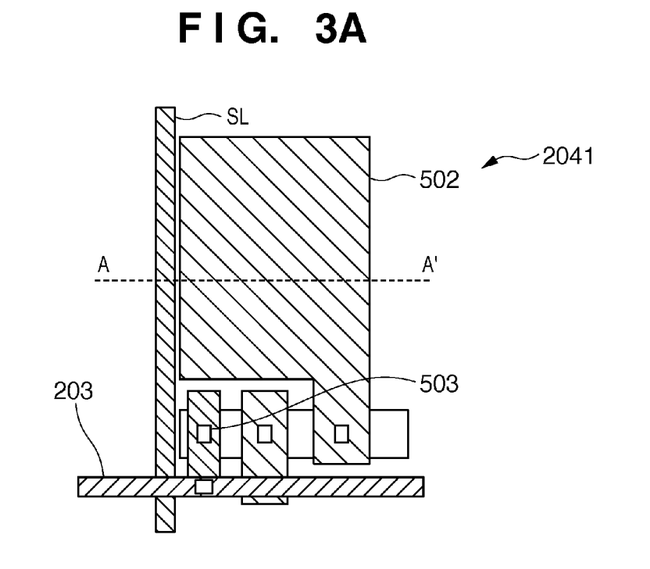
FIGS. 3A and 3B are views showing the layout and sectional structure of the photo-electric conversion device 100 according to the first embodiment.
Figure 3B:
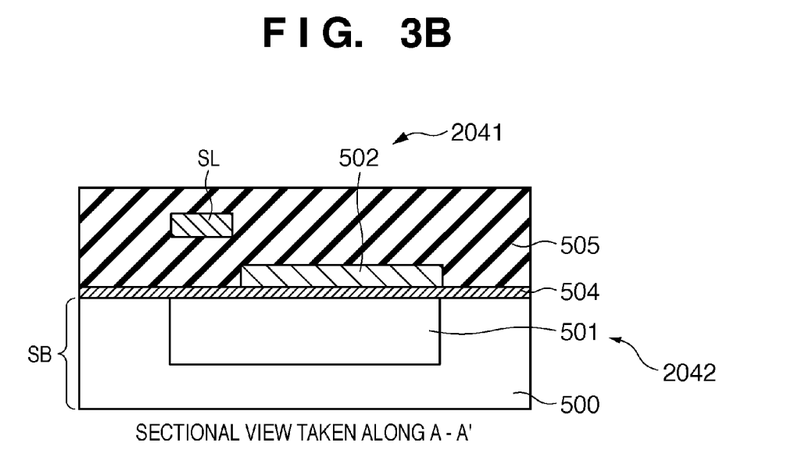

The positional relationship between the signal line SL and the first electrode 2041 of the hold capacitance 204 will be explained next with reference to FIGS. 3A and 3B. FIG. 3A is a view showing the layout of the signal line SL, the first electrode 2041 of the hold capacitance 204, and the switch 205. FIG. 3B is a sectional view taken along a line A-A' in FIG. 3A. The first electrode 2041 of the hold capacitance 204 includes a polysilicon electrode 502. Referring to FIG. 3A, the first electrode 2041 of the hold capacitance 204 connected to the gate electrode of the load transistor 202 includes the polysilicon electrode 502. The polysilicon electrode 502 is laid out near the intersection of the signal line SL and the common gate line 203. The polysilicon electrode 502 is connected to the common gate line 203 via the switch 205 and contact holes 503. As shown in FIG. 3B, the second electrode (reference electrode) 2042 of the hold capacitance 204 includes a p-well 501. The p-well 501 is formed on an n-region 500 in a semiconductor substrate SB. In this embodiment, the p-well 501 (second electrode 2042) is connected to the second reference potential via the common reference potential line GL (not shown). The second reference potential can be, for example, the ground potential. The second reference potential need not always be the ground potential but may be a reference potential having a fixed value. The polysilicon electrode 502 opposes the p-well 501 via a gate insulating film (oxide film) 504 to form the hold capacitance 204. On the other hand, the signal line SL is included in, for example, an aluminum (to be referred to as AL hereinafter) conductive line layer of the lowermost layer (first layer) of the multilayered conductive line structure. An interlayer insulating film 505 fills the space between the AL conductive line layers of the multilayered conductive line structure. The signal line SL is arranged on the gate insulating film 504 and the interlayer insulating film 505 on the semiconductor substrate SB.

As the pitch between the pixels of the pixel array decreases, the distance between the signal line SL and the first electrode 2041 of the hold capacitance 204 shortens. Hence, the coupling capacitance 304 (FIG. 2B) between them tends to increase. During the period of transferring the optical signals/noise signals to the holding circuit 104 via the signal lines SL (S read period/N read period), the switch 205 between the hold capacitance 204 and common gate line 203 is turned off. The hold capacitance 204 holds the gate voltage of the load transistor 202. Assume that the potential of the signal line SL is fluctuated by ΔV in signal read. At this time, the switch 205 is OFF. Let Ch be the capacitance value of the hold capacitance 204, and Cp be the capacitance value of the coupling capacitance between the signal line SL and the first electrode 2041 of the hold capacitance 204. The gate potential of the load transistor 202 is fluctuated by $$\Delta V' = \Delta V \times (Cp/Ch) \quad (1)$$

At this time, a fluctuation amount ΔI of the constant current is given by $$\Delta I = \Delta V' \times gm \quad (2)$$

where gm is the transconductance of the load transistor. According to equations (1) and (2), when a large signal is input to some pixels of the pixel array, and the potential of the signal line SL is largely fluctuated, the constant current supplied from the load transistor 202 to the signal line SL is fluctuated. A current corresponding to the fluctuation in the constant current flows to the reference potential line (for example, ground line) commonly connected to all columns. Since the reference potential line generally has no little resistance, a potential difference is generated between different constant current circuits 103. The fluctuation in the second reference potential (for example, ground potential) in each column influences an image corresponding to a signal transmitted via the signal line SL. Especially when the sources of the plurality of load transistors 202 are connected to the common first reference potential, "horizontal smear" may occur in the image. The horizontal smear is a phenomenon that generates band-shaped shadows on the left and right sides of a high-luminance object in an image. To suppress the fluctuation in the constant current supplied by the load transistor 202, the capacitance value of the hold capacitance may be increased, as indicated by equation (1). At this time, the capacitance value of the hold capacitance is preferably 100 fF or more. However, as the pixel pitch decreases, the area to form the hold capacitance is limited. For this reason, there is a limit in increasing the capacitance value of the hold capacitance. In addition, when the coupling capacitance 304 increases, the fluctuation in the potential of the first electrode 2041 of the hold capacitance 204 caused by the variation of the signal line SL becomes large. That is, as the pitch between the pixels of the pixel array decreases, the influence of the coupling capacitance 304 becomes non-negligible.

In this embodiment, the first electrode 2041 (polysilicon electrode 502) of the hold capacitance 204 and the signal line SL (AL conductive line) are arranged while ensuring an offset between them so as not to overlap in a direction perpendicular to the semiconductor substrate SB. In other words, when viewed from the direction perpendicular to the surface of the semiconductor substrate SB, i.e., the direction perpendicular to the light-receiving surface of the photo-electric converter 51, the signal line SL is arranged not to overlap the first electrode 2041 (polysilicon electrode 502). When the first electrode 2041 (polysilicon electrode 502) of the hold capacitance 204 and the signal line SL (AL conductive line) are thus arranged with an offset, the capacitance value Cp of the coupling capacitance 304 can be reduced. This allows to make (Cp/Ch) of equation (1) smaller. That is, $$Cp/Ch < 1/500 \quad (3)$$

can hold. If (Cp/Ch) is equal to or large than (1/500), the constant current fluctuation amount ΔI of equation (2) is larger than a threshold. If the constant current fluctuation amount ΔI is larger than the threshold, the influence of "horizontal smear" is noticeable in an image corresponding to a signal transmitted via the signal line. On the other hand, when inequality (3) is satisfied, the constant current fluctuation amount ΔI can be suppressed to the threshold or less. That is, it is possible to suppress the fluctuation in the constant current flowed from the load transistor 202, which is caused by the coupling capacitance 304 between the signal line SL and the first electrode 2041 of the hold capacitance 204. As a result, the influence of "horizontal smear" can be made unnoticeable in an image corresponding to a signal transmitted via the signal line SL. Note that the signal line SL has been described as an AL conductive line. However, the signal line SL may be made of another material such as copper (Cu). The first electrode of the hold capacitance 204 has been described as a polysilicon electrode. However, it may be an electrode made of another material. At least satisfying the relation given by inequality (3) suffices. The coupling capacitance 304 between the signal line SL and the first electrode of the hold capacitance 204 may be reduced by thickening the interlayer insulating film 505 between the signal line SL and the polysilicon electrode 502. When viewed from the direction perpendicular to the light-receiving surface of the photo-electric converter 51, the common gate line 203 is arranged not to overlap the polysilicon electrode (first electrode) 502 in a direction in which the common gate line 203 crosses the signal line SL. This enables to decrease the coupling capacitance between the common gate line 203 and the first electrode 2041 (polysilicon electrode 502) of the hold capacitance 204. It is consequently possible to suppress a fluctuation in the constant current supplied by the load transistor 202, which is caused by the coupling capacitance between the common gate line 203 and the first electrode of the hold capacitance 204.

Figure 4:
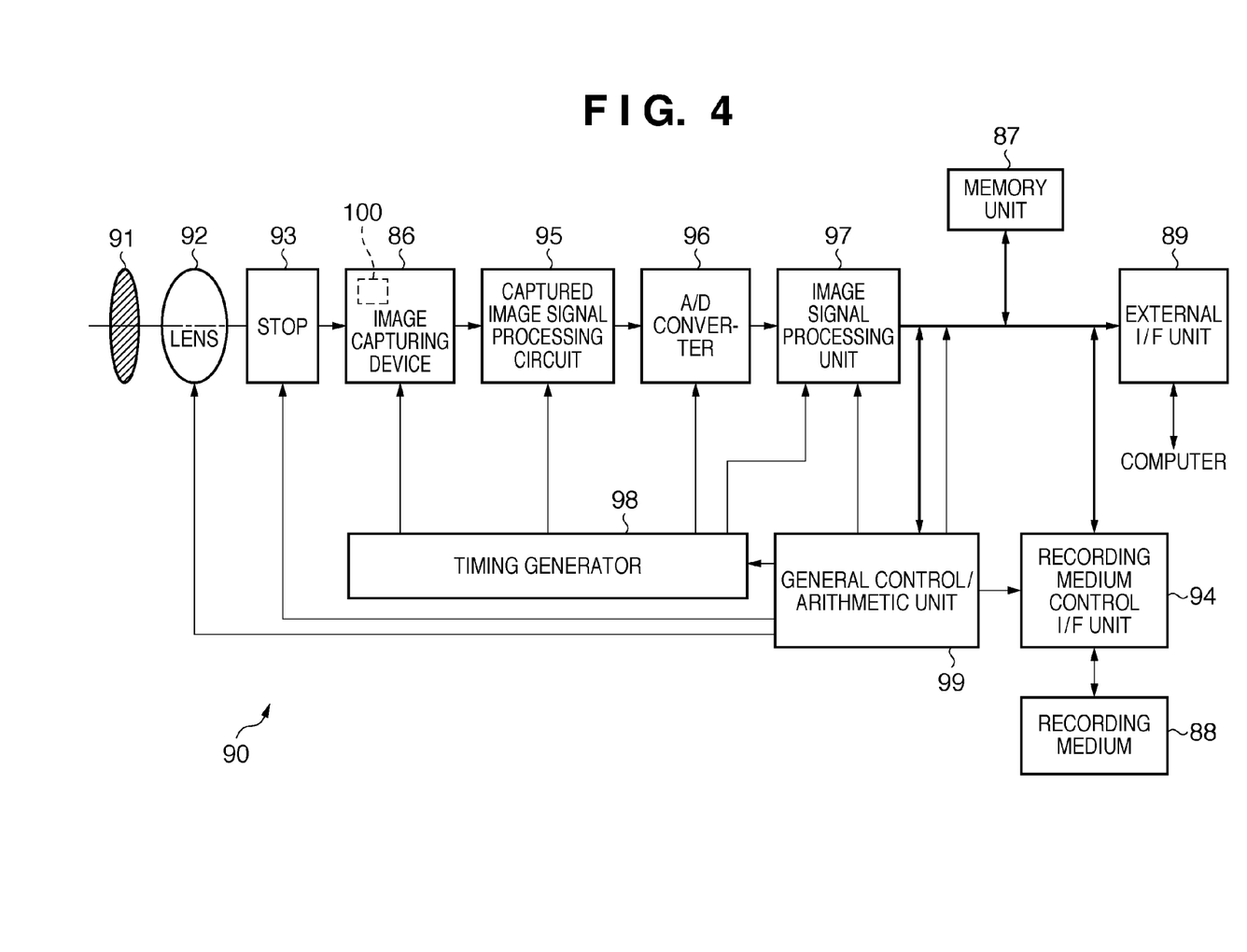
FIG. 4 is a block diagram showing the arrangement of an image capturing system using the photo-electric conversion device according to the first embodiment.

FIG. 4 illustrates an example of an image capturing system using the photo-electric conversion device of the present invention. As shown in FIG. 4, an image capturing system 90 mainly include an optical system, image capturing device 86, and signal processing unit. The optical system mainly includes a shutter 91, a lens 92, and a diaphragm 93. The image capturing device 86 includes the photo-electric conversion device 100. The signal processing unit mainly includes a captured image signal processing circuit 95, an A/D converter 96, an image signal processing unit 97, a memory unit 87, an external I/F unit 89, a timing generator 98, a general control/arithmetic unit 99, a recording medium 88, and a recording medium control I/F unit 94. Note that the signal processing unit need not always include the recording medium 88. The shutter 91 is provided on the optical path in front of the lens 92 to control exposure. The lens 92 refracts incident light and forms an object image on the imaging plane of the photo-electric conversion device 100 in the image capturing device 86. The diaphragm 93 is provided on the optical path between the lens 92 and the photo-electric conversion device 100 to adjust the amount of light that has passed through the lens 92 and is guided to the photo-electric conversion device 100. The photo-electric conversion device 100 in the image capturing device 86 converts the object image formed on the imaging plane of the photo-electric conversion device 100 into an image signal. The image capturing device 86 outputs the image signal read out from the photo-electric conversion device 100. The captured image signal processing circuit 95 is connected to the image capturing device 86 to process the image signal output from the image capturing device 86. The A/D converter 96 is connected to the captured image signal processing circuit 95 to convert the processed image signal (analog signal) output from the captured image signal processing circuit 95 into an image signal (digital signal). The image signal processing unit 97 is connected to the A/D converter 96 to perform arithmetic processing such as various kinds of correction for the image signal (digital signal) output from the A/D converter 96, thereby generating image data. The image data is supplied to the memory unit 87, external I/F unit 89, general control/arithmetic unit 99, recording medium control I/F unit 94, and the like. The memory unit 87 is connected to the image signal processing unit 97 to store the image data output from the image signal processing unit 97. The external I/F unit 89 is connected to the image signal processing unit 97. The image data output from the image signal processing unit 97 is transferred to an external device (e.g., personal computer) via the external I/F unit 89. The timing generator 98 is connected to the image capturing device 86, captured image signal processing circuit 95, A/D converter 96, and image signal processing unit 97 to supply timing signals to the image capturing device 86, captured image signal processing circuit 95, A/D converter 96, and image signal processing unit 97. The image capturing device 86, captured image signal processing circuit 95, A/D converter 96, and image signal processing unit 97 operate in synchronism with the timing signals. The general control/arithmetic unit 99 is connected to the timing generator 98, image signal processing unit 97, and recording medium control I/F unit 94 to generally control the timing generator 98, image signal processing unit 97, and recording medium control I/F unit 94. The recording medium 88 is detachably connected to the recording medium control I/F unit 94. The image data output from the image signal processing unit 97 is recorded in the recording medium 88 via the recording medium control I/F unit 94. The above-described arrangement enables to obtain a high-quality image (image data) if a high-quality image signal is obtained by the photo-electric conversion device 100.

Figure 5A:
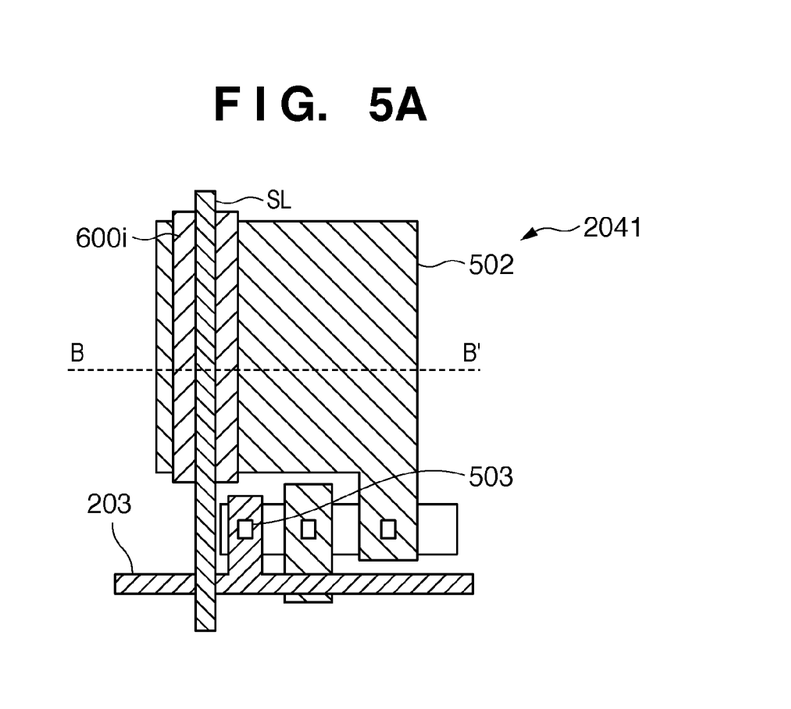
FIGS. 5A and 5B are views showing the layout and sectional structure of a photo-electric conversion device 100$i$ according to the second embodiment.
Figure 5B:
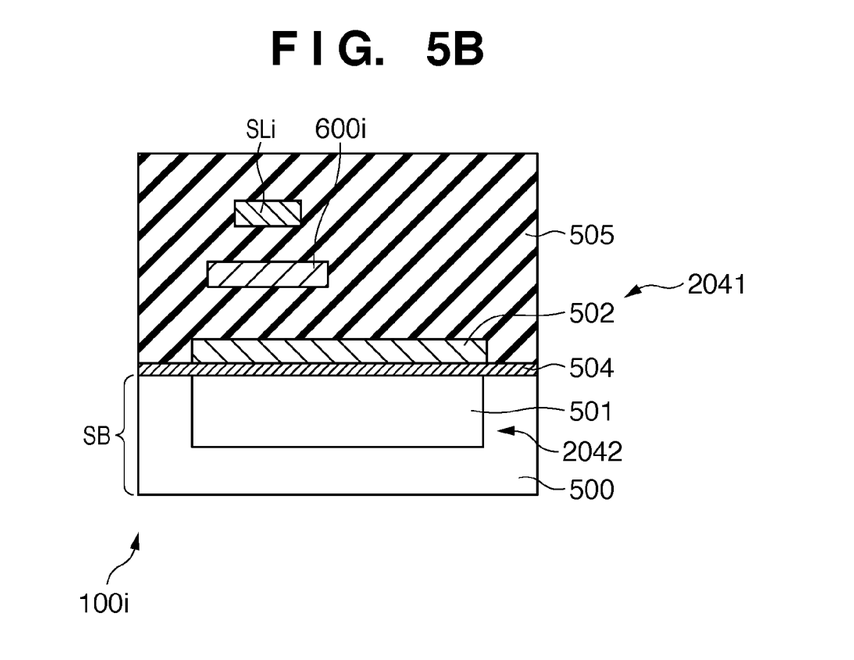

A photo-electric conversion device 100i according to the second embodiment of the present invention will be described next with reference to FIGS. 5A and 5B. FIG. 5A is a view showing the layout of a signal line SLi and a first electrode 2041 of a hold capacitance 204. FIG. 5B is a sectional view taken along a line B-B' in FIG. 5A. Points different from the first embodiment will mainly be described below. As shown in FIGS. 5A and 5B, the photo-electric conversion device 100i further includes a shield (or shield layer) 600i arranged between the signal line SLi and the first electrode 2041 (polysilicon electrode 502). The shield 600i can be included in, for example, an AL conductive line layer of the lowermost layer (first layer) of the multilayered conductive line structure. The signal line SLi can be included in, for example, an AL conductive line layer of a layer (second layer) above the lowermost layer of the multilayered conductive line structure. A common gate line 203 can be included in, for example, the AL conductive line layer of the lowermost layer (first layer) of the multilayered conductive line structure. Referring to FIG. 5B, the shield 600i is located between the signal line SLi and the polysilicon electrode 502 to suppress the coupling capacitance between them. More specifically, the shield 600i is connected to a fixed potential via a conductive line (not shown). The fixed potential can be the ground potential. The fixed potential may be another potential as far as it is fixed. Even when the signal line SLi and the polysilicon electrode 502 are laid out to overlap two-dimensionally (when viewed from a direction perpendicular to the light-receiving surface of a photo-electric converter 51), the arrangement can sufficiently reduce a capacitance value Cp of a coupling capacitance 304 (FIG. 2B) between them. Hence, even when the pixel pitch of the pixel array is narrower than in the first embodiment, (Cp/Ch) of equation (1) can be made smaller. That is, (Cp/Ch) can be made smaller to satisfy inequality (3). It is therefore possible to suppress the fluctuation in the constant current flowed from the load transistor, which is caused by the coupling capacitance between the signal line and the first electrode of the hold capacitance.

Figure 6A:
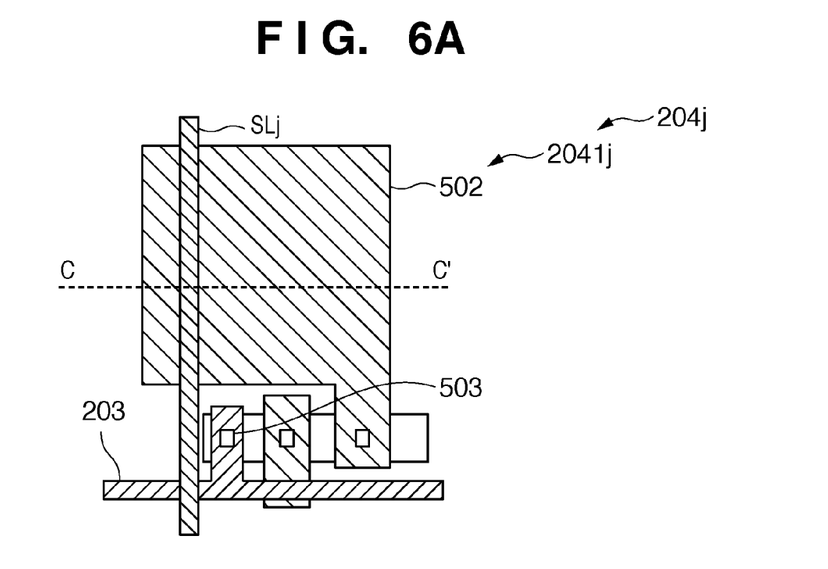
FIGS. 6A and 6B are views showing the layout and sectional structure of the photo-electric conversion device 100$j$ according to the third embodiment.
Figure 6B:
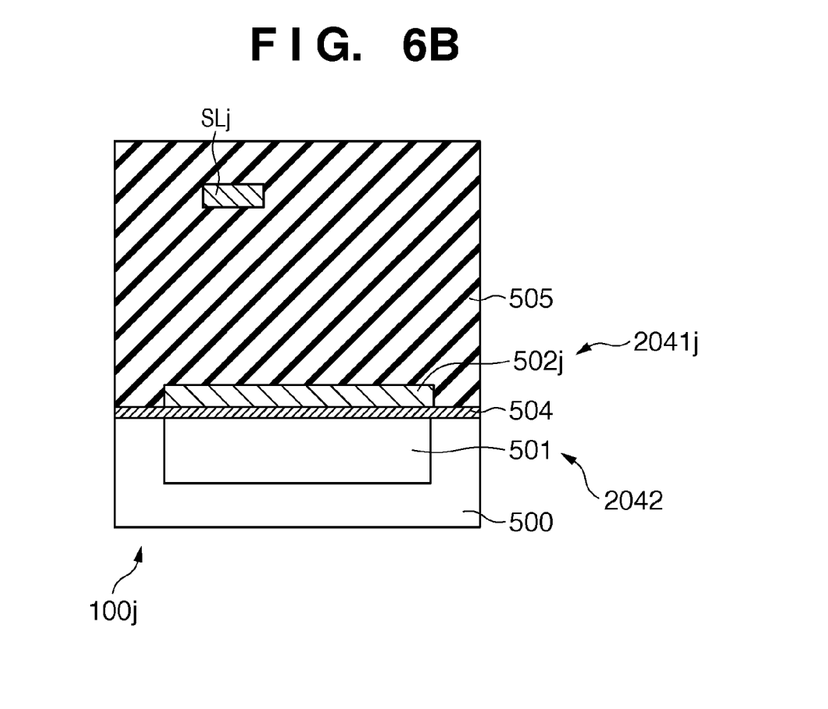

A photo-electric conversion device 100j according to the third embodiment of the present invention will be described next with reference to FIGS. 6A and 6B. FIG. 6A is a view showing the layout of a signal line SLj and a first electrode 2041j of a hold capacitance 204j. FIG. 6B is a sectional view taken along a line C-C' in FIG. 6A. Points different from the first embodiment will mainly be described below. As shown in FIGS. 6A and 6B, in the photo-electric conversion device 100j, the signal line SLj is arranged to overlap the first electrode 2041j (polysilicon electrode 502) when viewed from a direction perpendicular to the surface of a semiconductor substrate SB, i.e., a direction perpendicular to the light-receiving surface of a photo-electric converter 51. The influence of the coupling capacitance between the signal line SLj and the first electrode 2041j of the hold capacitance 204j may be non-negligible. In this case as well, the signal line SLj is included in, for example, an AL conductive line layer of a layer (second layer) above the lowermost layer of the multilayered conductive line structure. Hence, the difference between the height of the signal line SLj and that of the first electrode 2041j of the hold capacitance 204j from the light-receiving surface of the photo-electric converter 51 is larger than in the first embodiment. Even when the signal line SLj and the polysilicon electrode 502 are laid out to overlap two-dimensionally (when viewed from a direction perpendicular to the light-receiving surface of the photo-electric converter 51), the arrangement can sufficiently reduce a capacitance value Cp of a coupling capacitance 304 (FIG. 2B) between them. Hence, even when the pixel pitch of the pixel array is narrower than in the first embodiment, (Cp/Ch) of equation (1) can be made smaller. That is, (Cp/Ch) can be made smaller to satisfy inequality (3). It is therefore possible to suppress the fluctuation in the constant current flowed from a load transistor 202j, which is caused by the coupling capacitance 304 between the signal line and the first electrode of the hold capacitance. Note that the signal line SLj may be included in an nth layer (n is an integer larger than 3) above the second layer of the multilayered conductive line structure. The capacitance value Cp of the coupling capacitance 304 (FIG. 2B) can sufficiently be reduced by thickening an interlayer insulating film 505 between the signal line SLj and the polysilicon electrode 502. When the signal line SLj is included in the conductive line layer of the lowermost layer (first layer) of the multilayered conductive line structure, the planer distance (the distance in a direction along the light-receiving surface of the photo-electric converter 51) between the signal line SLj and the polysilicon electrode 502 can slightly be increased. That is, the signal line SLj and the polysilicon electrode 502 may be laid out not to overlap two-dimensionally (when viewed from the direction perpendicular to the light-receiving surface of the photo-electric converter 51). In this case, it is possible to obtain an effect of reducing the coupling capacitance by increasing the difference between the height of the signal line SLj and that of the polysilicon electrode 502 from the light-receiving surface of the photo-electric converter 51, in addition to the effect of the first embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-101382, filed Apr. 17, 2009, and No. 2010-081641, filed Mar. 31, 2010, which are hereby incorporated by reference herein in their entirety.

What is claimed is:

1. A photo-electric conversion device comprising:
    a pixel array in which a plurality of pixels are arrayed to form rows and columns, each pixel including a photo-electric converter, a floating diffusion portion, a transfer unit which transfers charges generated in the photo-electric converter to the floating diffusion portion, and an output unit which outputs a signal corresponding to a potential of the floating diffusion portion;
    signal lines corresponding to the respective columns of the pixel array, each of the signal lines being connected to the pixels of the corresponding column of the pixel array to transmit a signal output from each of the pixels of the corresponding column of the pixel array, the signal lines being arranged in parallel in a first direction;
    load transistors corresponding to the respective signal lines, each of the load transistors including a drain connected to the corresponding signal line and a source connected to a first reference potential line to which a first reference potential is applied; and
    capacitances corresponding to the respective load transistors, each of the capacitances including a first electrode connected to a gate of the corresponding load transistor, and a second electrode connected to a second reference potential line to which a second reference potential is applied,
    wherein both the first electrodes of the capacitances and the signal lines are arranged in a cross-section perpendicular to the first direction, and each first electrode is arranged between adjacent signal lines to not overlap the adjacent signal lines, when viewed from a direction perpendicular to a light-receiving surface of the photo-electric converter.

2. The device according to claim 1, further comprising:
    a supply unit which supplies a bias voltage to the capacitances; and
    switches which are turned on to connect the respective first electrodes to the supply unit and turned off to disconnect the respective first electrodes from the supply unit,
    wherein the capacitances receive the bias voltage supplied by the supply unit while the switches are turned on, and hold the bias voltage and supply the bias voltage to the gate of the load transistors while the switches are turned off.

3. The device according to claim 1, wherein Ch is a capacitance value of the capacitance provided for a given column of the pixel array, and Cp is a capacitance value of a coupling capacitance between the signal line and the first electrode which are provided for the given column of the pixel array, and wherein $Cp/Ch < 1/500$.

4. The device according to claim 1, wherein the signal lines are arranged to overlap the second electrode of the corresponding capacitance when viewed from the direction perpendicular to the light-receiving surface of the photo-electric converter.

5. The device according to claim 4, wherein the second electrode of the corresponding capacitance includes a p-well formed in a semiconductor substrate.

6. The device according to claim 1, further comprising a holding circuit configured to hold signals transmitted through the signal lines, wherein the capacitances are arranged between the pixel array and the holding circuit.

7. An image capturing system comprising:
    a photo-electric conversion device of claim 1;
    an optical system which forms an image on an imaging plane of the photo-electric conversion device; and
    a signal processing unit which processes a signal output from the photo-electric conversion device to generate image data.

8. The device according to claim 1, further comprising a holding circuit configured to hold signals transmitted through the signal lines, wherein the load transistors and the capacitances are arranged in an area between the pixel array and the holding circuit, and
   wherein the signal lines are arranged to pass through the area, and the first electrode is arranged between adjacent signal lines to not overlap the adjacent signal lines, when viewed from the direction perpendicular to the light-receiving surface of the photo-electric converter.

9. The device according to claim 8, wherein the signal lines extend from the pixel array to the holding circuit to pass through the area between the pixel array and the holding circuit, and the first electrode is arranged between adjacent signal lines to not overlap the adjacent signal lines, when viewed from the direction perpendicular to the light-receiving surface of the photo-electric converter.

\* \* \* \* \*